US011581898B2

(12) United States Patent
Lindner et al.

(10) Patent No.: US 11,581,898 B2
(45) Date of Patent: Feb. 14, 2023

(54) CIRCUIT FOR ANALOG/DIGITAL CONVERSION

(71) Applicant: WAGO Verwaltungsgesellschaft mbH, Minden (DE)

(72) Inventors: Thorsten Lindner, Hannover (DE); Matthias Kruehler, Bueckeburg (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 17/339,403

(22) Filed: Jun. 4, 2021

(65) Prior Publication Data

US 2021/0384914 A1    Dec. 9, 2021

(30) Foreign Application Priority Data

Jun. 5, 2020    (DE) ...................... 10 2020 115 090.3

(51) Int. Cl.
*H03M 1/12*    (2006.01)
*H03M 1/10*    (2006.01)

(52) U.S. Cl.
CPC ......... *H03M 1/1071* (2013.01); *H03M 1/124* (2013.01)

(58) Field of Classification Search
CPC ...... H03M 1/12; H03M 1/089; H03M 1/1071; H03M 1/1023; H03M 1/06; H03M 1/0604; H03M 1/122; H03M 1/1245; H03M 1/124
USPC .................................. 341/118–122, 140–142
See application file for complete search history.

(56) References Cited

U.S. PATENT DOCUMENTS

| | | | | |
|---|---|---|---|---|
| 4,357,600 A | * | 11/1982 | Ressmeyer | H03M 1/52 341/129 |
| 5,317,520 A | * | 5/1994 | Castle | G01K 7/20 702/58 |
| 5,829,876 A | * | 11/1998 | Schwartz | G01K 7/13 374/1 |
| 7,447,247 B1 | * | 11/2008 | Doscher | H01S 5/06808 372/38.1 |
| 7,712,958 B2 | | 5/2010 | Burmeister et al. | |
| 8,009,078 B1 | * | 8/2011 | Alley | H03M 3/392 379/403 |

(Continued)

FOREIGN PATENT DOCUMENTS

| | | |
|---|---|---|
| CN | 202928712 U | 5/2013 |
| DE | 10359988 A1 | 7/2005 |

(Continued)

*Primary Examiner* — Linh V Nguyen

(74) *Attorney, Agent, or Firm* — Muncy, Geissler, Olds & Lowe, P.C.

(57) ABSTRACT

A circuit for analog-digital conversion, which includes a first connection and a second connection and a third connection and a fourth connection for connecting a sensor, an analog-digital converter (ADC), whose first input is connected to the first connection and whose second input is connected to the second connection, a first current source circuit for outputting a first output current, a first switching device for the switchable connection of the first current source circuit to the first connection or to the third connection, a current source/sink circuit for outputting a second output current, a second switching device for the switchable connection of the current source/sink circuit to a reference potential or to the second connection, and a third switching device for the switchable connection of the reference potential to the second connection or to the fourth connection.

12 Claims, 9 Drawing Sheets

(56) References Cited

U.S. PATENT DOCUMENTS

| | | | |
|---|---|---|---|
| 8,449,181 B2* | 5/2013 | Rud | G01K 15/007 |
| | | | 374/185 |
| 8,884,629 B1 | 11/2014 | Kumar et al. | |
| 9,228,905 B2* | 1/2016 | Alley | G01K 7/20 |
| 9,683,900 B2* | 6/2017 | Mitsui | G01K 15/007 |
| 9,748,969 B1* | 8/2017 | Bach | H03M 3/496 |
| 9,887,702 B1* | 2/2018 | Miglani | H03M 1/0673 |
| 2008/0133170 A1 | 6/2008 | Engeistad | |
| 2012/0051399 A1 | 3/2012 | Rud et al. | |
| 2014/0142507 A1* | 5/2014 | Armes | A61M 5/20 |
| | | | 604/112 |
| 2017/0322089 A1 | 11/2017 | Kumar Beeram et al. | |
| 2018/0372788 A1 | 12/2018 | Beeram et al. | |
| 2019/0253065 A1* | 8/2019 | Ito | H03M 1/1245 |
| 2020/0059240 A1* | 2/2020 | Moue | H04N 5/3575 |
| 2020/0355732 A1* | 11/2020 | Koch | G01R 27/26 |

FOREIGN PATENT DOCUMENTS

| | | |
|---|---|---|
| DE | 112013004118 T5 | 5/2015 |
| DE | 102020105475 A1 | 10/2020 |
| EP | 1431768 A1 | 6/2004 |
| EP | 3355039 A1 | 8/2018 |

\* cited by examiner

CIRCUIT FOR ANALOG/DIGITAL CONVERSION

This nonprovisional application claims priority under 35 U.S.C. § 119(a) to German Patent Application No. 10 2020 115 090.3, which was filed in Germany on Jun. 5, 2020 and which is herein incorporated by reference.

BACKGROUND OF THE INVENTION

Field of the Invention

The present invention relates to a circuit for analog/digital conversion. In particular, the present invention relates to a measuring transducer which includes a circuit for analog/digital conversion.

Description of the Background Art

A measuring transducer can convert an analog signal into a digital value and map it to a measured value (for example a physical variable) with the aid of a nonlinear measurement function.

SUMMARY OF THE INVENTION

It is therefore an object of the present invention to provide a circuit for analog/digital conversion having a first connection and a second connection and a third connection and a fourth connection for connecting a sensor, an analog/digital converter (ADC), whose first input is connected to the first connection and whose second input is connected to the second connection, a first current source circuit for outputting a first output current, a first switching device for the switchable connection of the first current source circuit to the first connection or to the third connection, a current source/sink circuit for outputting a second output current, a second switching device for the switchable connection of the current source/sink circuit to a reference potential or to the second connection, and a third switching device for the switchable connection of the reference potential to the second connection or to the fourth connection.

The term "circuit," can be understood to be, for example, an assembly of electrical and electronic components to form a functional arrangement. For example, the circuit may be part of a measuring transducer, which converts sensor signals into measured values. In addition to the circuit according to the invention, the measuring transducer may also be provided with a circuit (for example with a processor), which is configured to map digital values output by the ADC to measured values, based on a nonlinear measurement function. The term "processor," can be understood to be, for example, an electronic circuit, which is configured to process commands from a command set (assigned to the processor), the sequence of commands (and possibly the arguments assigned to the commands) being predefined by the program executed by the processor. In addition, the term "nonlinear measurement function," can be understood to be, for example, a nonlinear assignment rule (for example, a computation rule), with the aid of which measured values may be assigned to the digital values. The measured values may be directed, for example, to a quantitative statement about a physical variable, e.g. the level of a temperature at a particular location. The measured values may be, for example, numerical values, which are provided by the processor in digital form.

The circuit (or the measuring transducer, if the circuit is part of a measuring transducer) may be arranged in a device. The device may be designed as an input/output module (I/O module). The term "I/O module," can be understood to be, for example, a module connectable or connected in series to a head station, which connects one or multiple field devices (for example, a sensor and/or an actuator) to the head station and possibly to a higher-level control unit (via the head station). In this connection, the term "head station," can be understood to be, for example, a modular field bus node, whose task is to make the data and/or the services of the I/O modules connected in series to the head station available via the field bus field bus connected to the head station.

Furthermore, the term "input," as used in the description and the claims, can be understood to be, for example, an electrical connection, via which electrical signals (for example voltage and/or current values) may be read in (and thus further processed in the ADC). The term "connection," can be understood to be, for example, an electrical contact point (for example a terminal connection having an electrical conductor, such as a spring-loaded terminal), which is configured for temporary or permanent connection to a (or the) electrical conductor. Moreover, the term "analog/digital converter," can be understood to be, for example, a circuit which determines in which of a large number of value ranges an analog value occurs, and which outputs a digital value corresponding to the particular value range. The digital value may be output, for example, as a bitstring.

Furthermore, the term "current source circuit," can be understood to be, for example, a circuit, which is configured to output a current of a determined intensity. The determined intensity may be positive or negative. Moreover, the term "switching device," can be understood to be, for example, a electronic switch or an arrangement of multiple electronic switches (for example, changeover switches). Furthermore, the term "current source/sink circuit," can be understood to be, for example, a circuit, which is configured to output or input a current of a determined intensity. In particular, the intensity may alternately take on positive or negative values.

It should moreover be noted that the ordinal numbers "first," "second," etc., as used in the description and the claims, do not define a sequence but are used only to enumerate and differentiate features.

The ADC may have a third input and a fourth input, the first current source circuit being connected to the first switching device via a resistor, and the third input and the fourth input being connected to the resistor.

The first switching device may have a leakage current of less than 3 nA and preferably less than 30 pA.

The circuit may include a control circuit for controlling the switching devices, the control circuit being configured to switch between multiple measurement modes.

In a first measurement mode, the first switching device may conductively connect the first current source circuit to the first connection, the second switching device may conductively connect the current source/sink circuit to the reference potential, and the third switching device may conductively connect the reference potential to the second connection.

In a second measurement mode, the first switching device may conductively connect the first current source circuit to the first connection, the second switching device may conductively connect the current source/sink circuit to the second connection, and the third switching device may conductively connect the reference potential to the fourth connection.

In a third measurement mode, the first switching device may conductively connect the first current source circuit to the third connection, the second switching device may conductively connect the current source/sink circuit to the reference potential, and the third switching device may conductively connect the reference potential to the fourth connection.

In a fourth measurement mode, the first switching device may conductively connect the first current source circuit to the first connection, the second switching device may conductively connect the current source/sink circuit to the reference potential, and the third switching device may conductively connect the reference potential to the fourth connection.

The ADC may have a fifth input and a sixth input, the fifth input and the sixth input being connected to a measuring resistor.

In a fifth measurement mode, the first switching device may conductively connect the first current source circuit to the reference potential via the measuring resistor, the second switching device may conductively connect the current source/sink circuit to the reference potential, and the third switching device may conductively connect the reference potential to the fourth connection, the analog/digital converter being configured to read in, via the measuring resistor, a voltage dropping over the fifth input and the sixth input.

The circuit for analog/digital conversion may include a fourth switching device for the switchable connection of a constant voltage to the third connection.

In a sixth measurement mode, the second switching device may conductively connect the current source/sink circuit to the second connection, the third switching device may conductively connect the reference potential to the fourth connection, and the fourth switching device may conductively connect the constant voltage to the third connection.

It is furthermore understood that the features described in connection with the circuit my also be features of a method in which the circuit is used.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
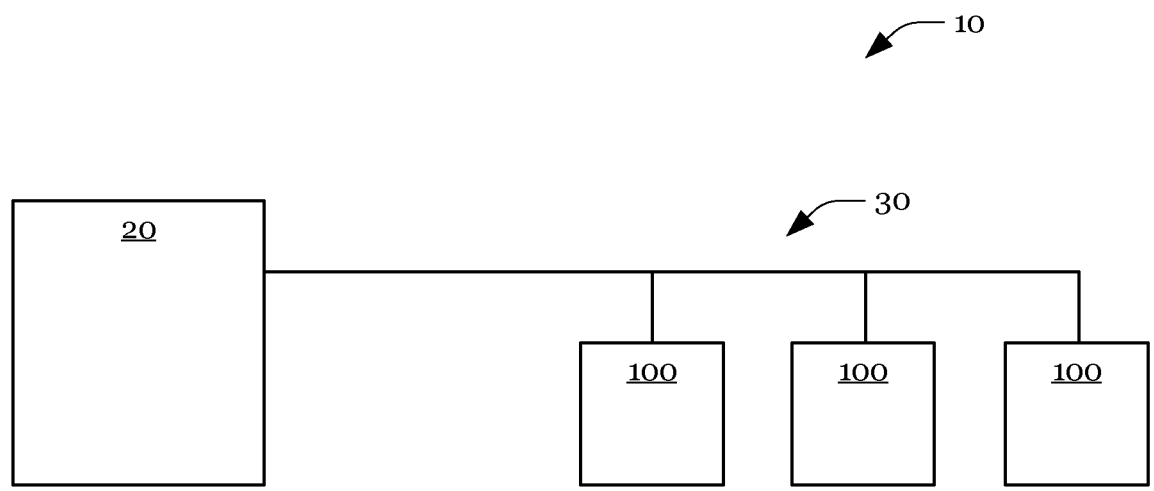
FIG. 1 shows a block diagram of a field bus system, which comprises a plurality of modular field bus nodes.

FIG. 1 shows a block diagram of a field bus system. Field bus system 10 comprises a higher-level control unit 20 and modular field bus nodes 100, which are connected to each other (via signals) via field bus 30. Higher-level control unit 20 may be used to monitor as well as regulate a system, which is controlled by field bus system 10. If higher-level control unit 20 monitors a system, higher-level control unit 20 may receive status data from field bus nodes 100 cyclically or acyclically, which describes the status of the system and generates an error signal or an alarm signal if the status of the system (substantially) deviates from a desired/permitted status or status range. If higher-level control unit 20 (not only monitors but also) regulates the system, higher-level unit 20 may receive status data from field bus nodes 100 cyclically or acyclically and ascertain control data transmitted to field bus nodes 100, taking the status data into account.

Figure 2:
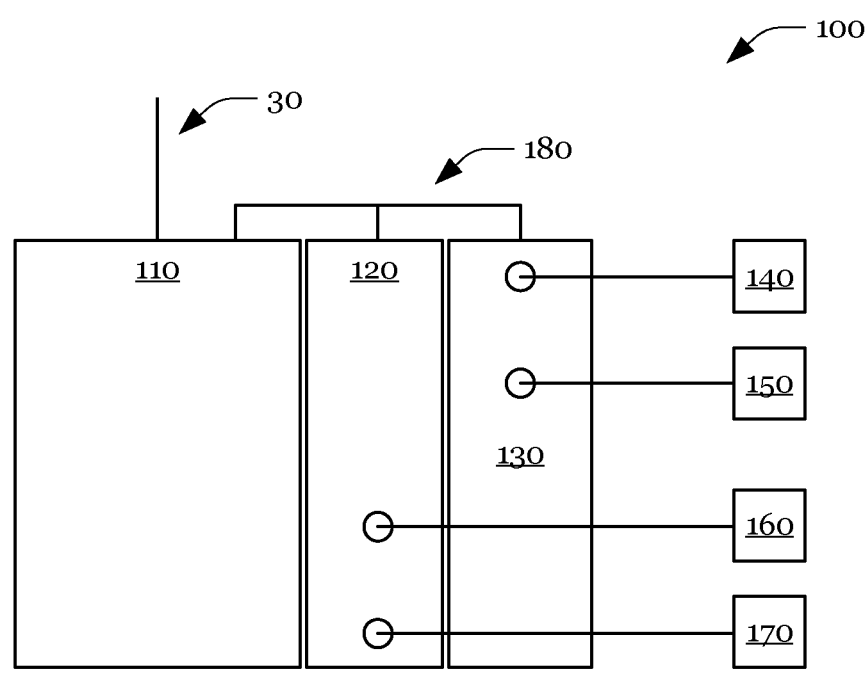
FIG. 2 shows a block diagram of a modular field bus note, which comprises a head station and a plurality of I/O modules and field bus devices connected to the I/O modules.

FIG. 2 shows a block diagram of a modular field bus node. Field bus node 100 comprises head station 110 and two I/O modules 120 and 130 connected in series to head station 110. Sensor 140 and sensor 150 are connected to I/O module 120, and sensor 160 and sensor 170 are connected to I/O module 130. During operation, I/O modules 120 and 130 read in sensor signals and generate status data from the sensor signals, which is transmitted to head station 110 via local bus 180. Head station 110 may process the status data locally and/or forward it (possibly in modified form) to higher-level control unit 20. Higher-level control unit 20 (or head station 110 in the case of local processing) may then generate control data, taking the status data into account.

The control data generated by higher-level control unit 20 may be transmitted to (the same) or (another) head station via field bus 30. The control data transmitted to the head station (or generated by head station 110) may then be forwarded/transmitted (possibly in modified form) to further I/O modules (possibly to further I/O modules of field bus nodes 100). The I/O modules receiving the control data may output control signals corresponding to the control data to outputs connected to the actuators. The communication of data between the components of field bus system 10 and the mapping of the sensor signals to status data and the mapping of control data to control signals may be adapted to different use scenarios by a configuration of field bus node(s) 100.

Figure 3:
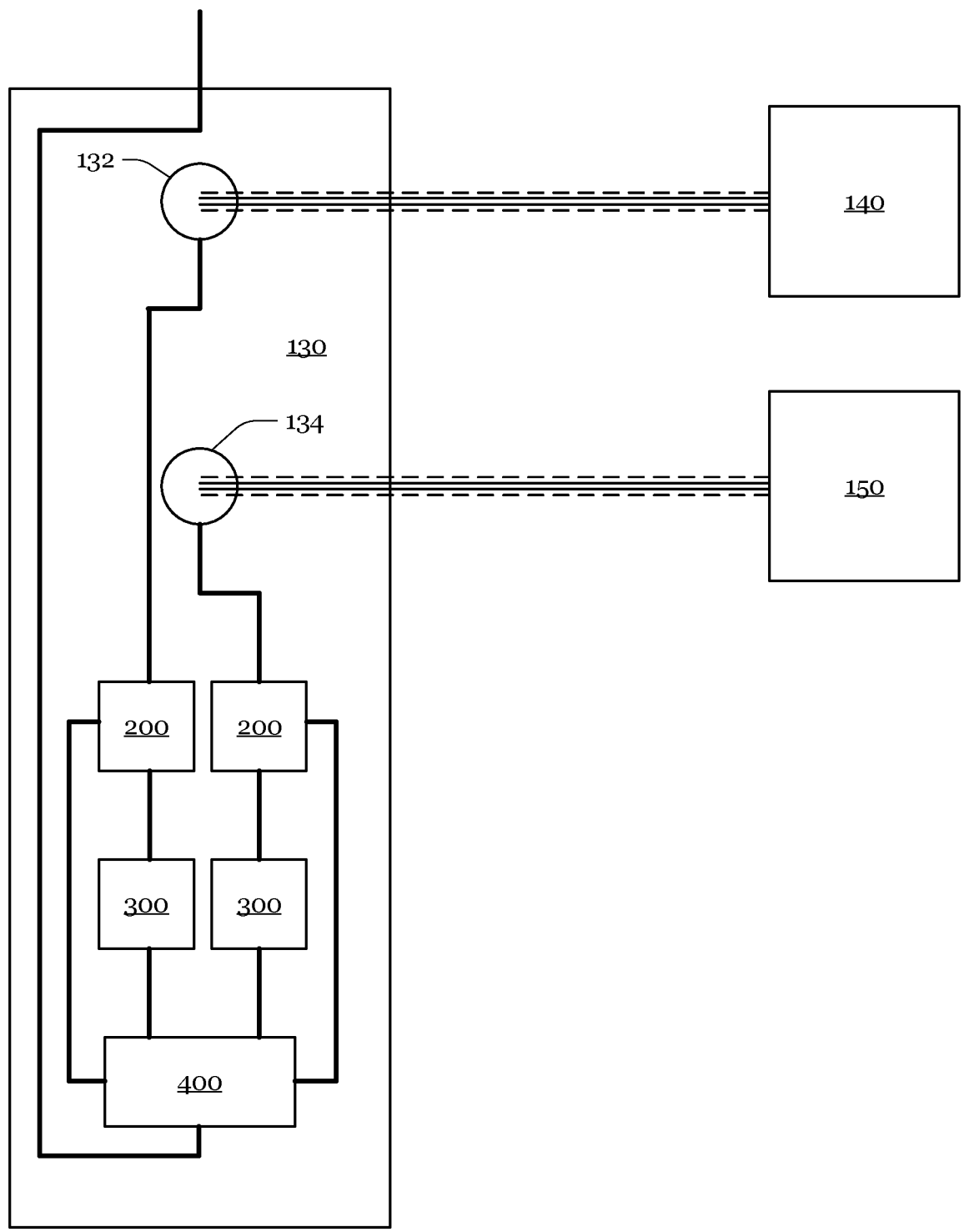
FIG. 3 shows a block diagram of an I/O module, which is provided with a measuring electronic system.

FIG. 3 shows a block diagram of I/O module 130. I/O module 130 comprises interface 132 and interface 134. Interface 132 and interface 134 each comprise four connections. Sensor 140 is connected to I/O module 130 via interface 132. Sensor 150 is connected to I/O module 130 via interface 134. Sensor 140 and sensor 150 may be, for example, temperature sensors, e.g. resistance temperature sensors or thermocouples. Interface 132 and interface 134 are connected to (input) circuits 200. Circuits 200 may be configured to apply a defined voltage to sensor 140 and sensor 150 or to generate a defined current flow through sensor 140 and sensor 150.

Circuits 200 may furthermore be configured to detect a current flow through sensor 140 and sensor 150 or to tap a voltage drop over sensor 140 and sensor 150 or to generate an analog voltage proportionate to the current flow/voltage drop or an analog current flow proportionate to the current flow/voltage drop. I/O module 130 further comprises ADCs 300 and microcontroller 400. ADCs 300 are configured to convert the analog voltages/currents into digital values. Microcontroller 400 includes a processor and a non-volatile memory. A program is stored in the non-volatile memory, which is processed by the processor and which causes the measured values to be assigned to the sensor signals converted into digital values by ADCs 300. Similarly to two-channel I/O module 130 illustrated in FIG. 3, one-channel or three-channel, four-channel or multichannel I/O modules may also be provided.

Figure 4:
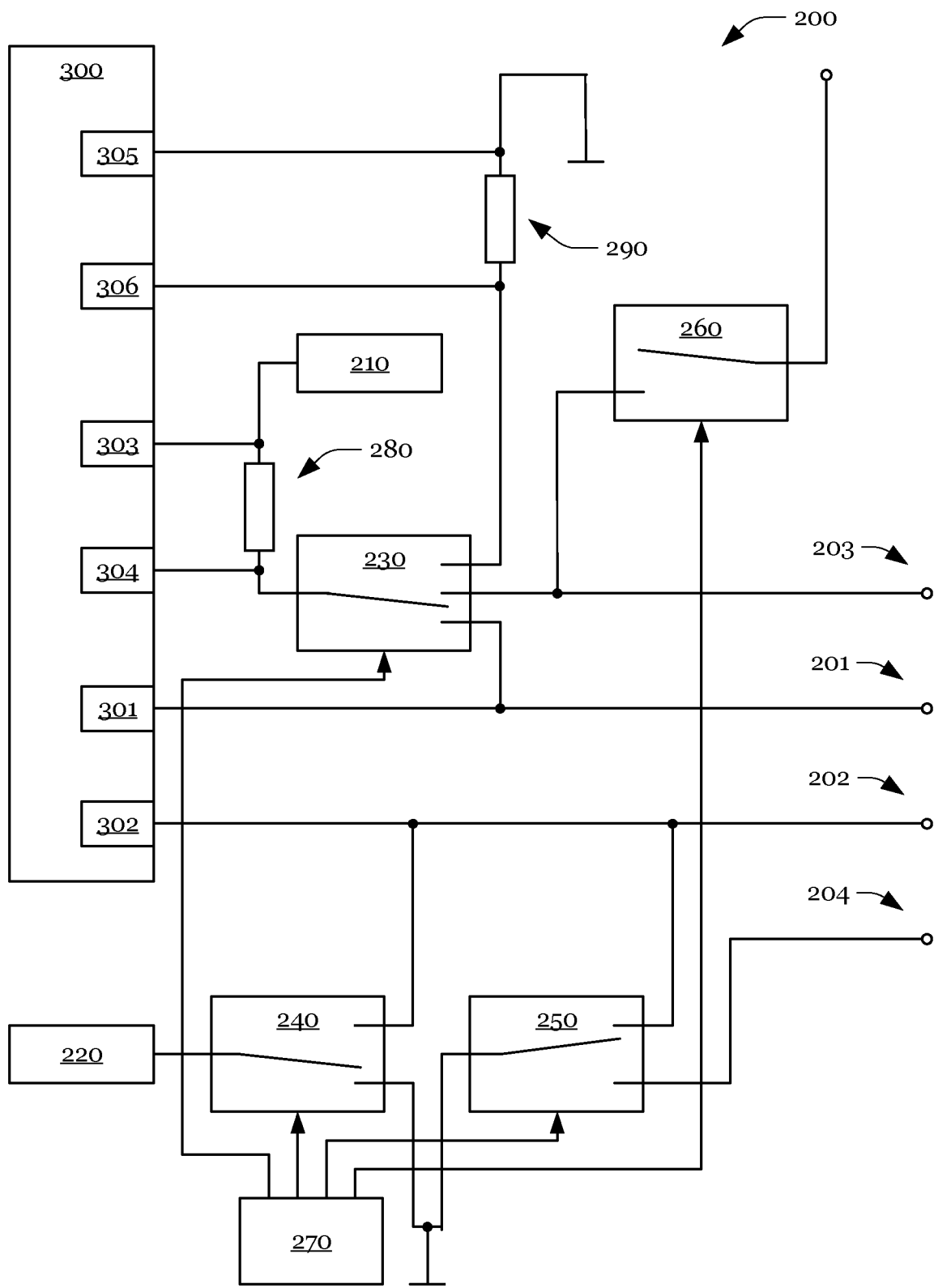
FIG. 4 shows a block diagram of a circuit, which is part of the measuring electronic system.

FIG. 4 shows a block diagram of circuit 200 and ADC 300. Circuit 200 comprises connection 201, connection 202, connection 203 and connection 204 for connecting sensor 140 or sensor 150. As indicated in FIG. 3, connection 203 and/or connection 204 may be occupied or unoccupied, depending on the sensor type. Input 301 and input 302 of ADC 300 are connected to connection 201 and connection 202. Circuit 200 comprises current source circuit 210 and switching device 230 for the switchable connection of current source circuit 210 to connection 201 or connection 203. Switching device 230 may be formed from two electronic switches arranged in series, which preferably have a leakage current of less than 3 nA and particularly preferably less than 30 pA.

Current source circuit 210 is connected to switching device 230 via resistor 280, ADC 300 being able to determine the voltage drop over resistor 280 via input 303 and input 304. The voltage drop may be used as a reference voltage for a test current output by current source circuit 210. Circuit 200 further comprises measuring resistor 290 (for example, a resistance thermometer), ADC 300 being able to determine the voltage drop over measuring resistor 290 via input 305 and input 306.

Circuit 200 further comprises current source/sink circuit 220 and switching device 240 for the switchable connection of current source/sink circuit 220 to a reference potential (e.g. ground) or to connection 202. Circuit 200 also comprises switching device 250 for the switchable connection of the reference potential to connection 202 or connection 204. In addition, circuit 200 comprises switching device 260 for the switchable connection of a constant voltage (e.g. 2.4 V) to connection 203. Switching device 240, switching device 250 and switching device 260 preferably also have a leakage current of less than 3 nA and particularly preferably less than 30 pA.

To control switching device 230, switching device 240, switching device 250 and switching device 260, circuit 200 comprises control circuit 270, control circuit 270 being configured to switch between multiple measurement modes. For each measurement mode, switch positions for the switching devices may be stored in a memory of control circuit 270. The switchover signal may be received via local bus 180 or input at I/O module 130 via an input unit. Control circuit 270 may be further configured to generate the switchover signal internally when control circuit 270 detects sensor 140 or sensor 150.

Figure 5:
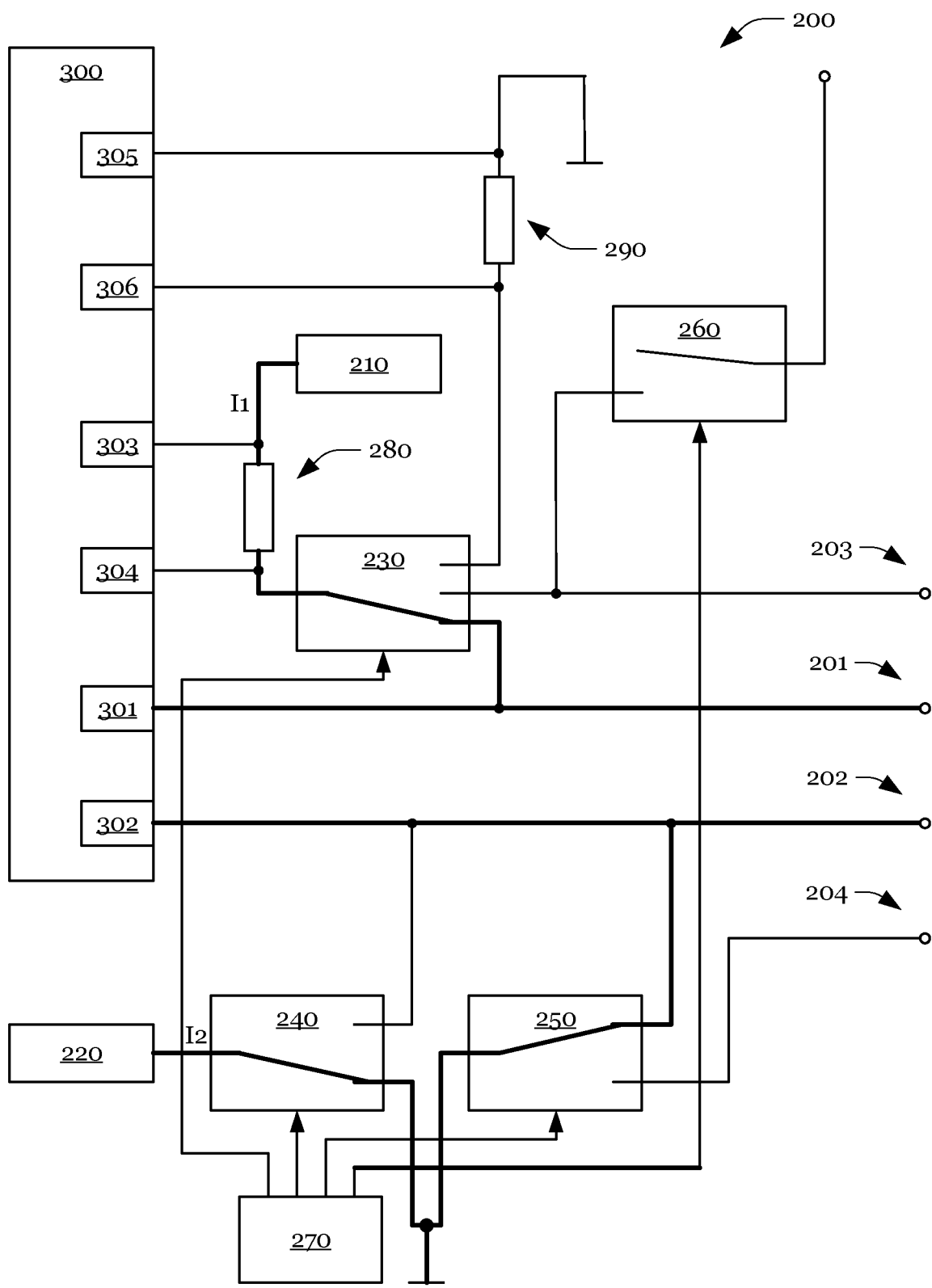
FIG. 5 shows the use of the circuit for implementing a first measurement mode.

FIG. 5 shows the use of circuit 200 for implementing a first measurement mode, in which sensor 140 or sensor 150 is designed, for example, as a 2-wire resistance thermometer. In this measurement mode, switching device 230 connects current source circuit 210 to connection 201, switching device 240 connects current source/sink circuit 220 to the reference potential, and switching device 250 connects the reference potential to connection 202. Test current 11 thus flows through sensor 140 or sensor 150, and the voltage drop over sensor 140 or sensor 150 may be determined from the potential difference between input 301 and input 302. For example, a temperature value may be derived from the voltage drop.

Figure 6:
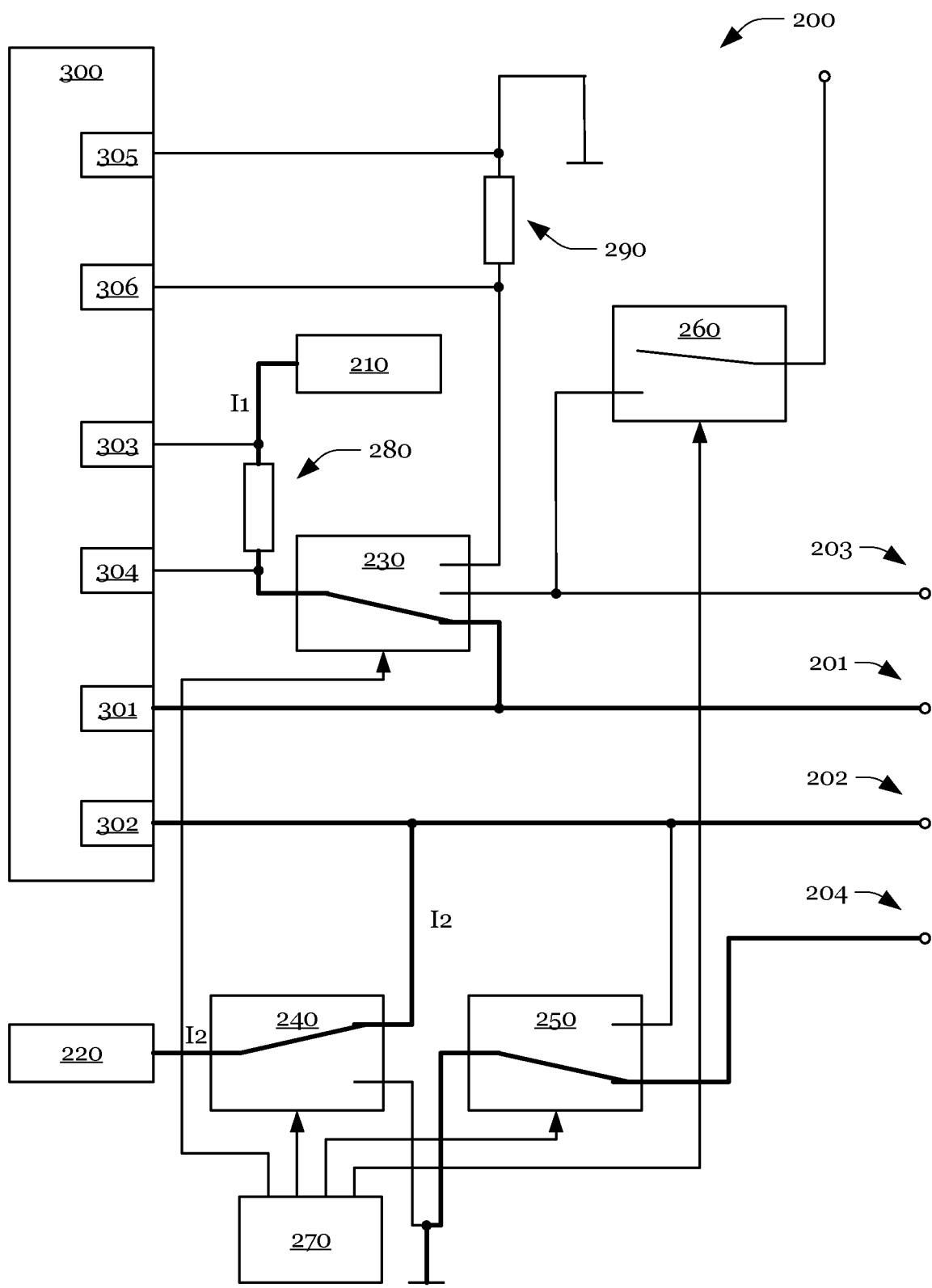
FIG. 6 shows the use of the circuit for implementing a second measurement mode.

FIG. 6 shows the use of circuit 200 for implementing a second measurement mode, in which sensor 140 or sensor 150 is designed, for example, as a 3-wire resistance thermometer. In this measurement mode, switching device 230 connects current source circuit 210 to connection 201, switching device 240 connects current source/sink circuit 220 to connection 202, and switching device 250 connects the reference potential to connection 204. Test current 11 thus flows through sensor 140 or sensor 150, and the voltage drop over sensor 140 or sensor 150 may be determined from the potential difference between input 301 and input 302. For example, a temperature value may be derived from the voltage drop. To compensate for the line resistance, current source/sink circuit 220 may output a current, which is of the same size as test current 11.

Figure 7:
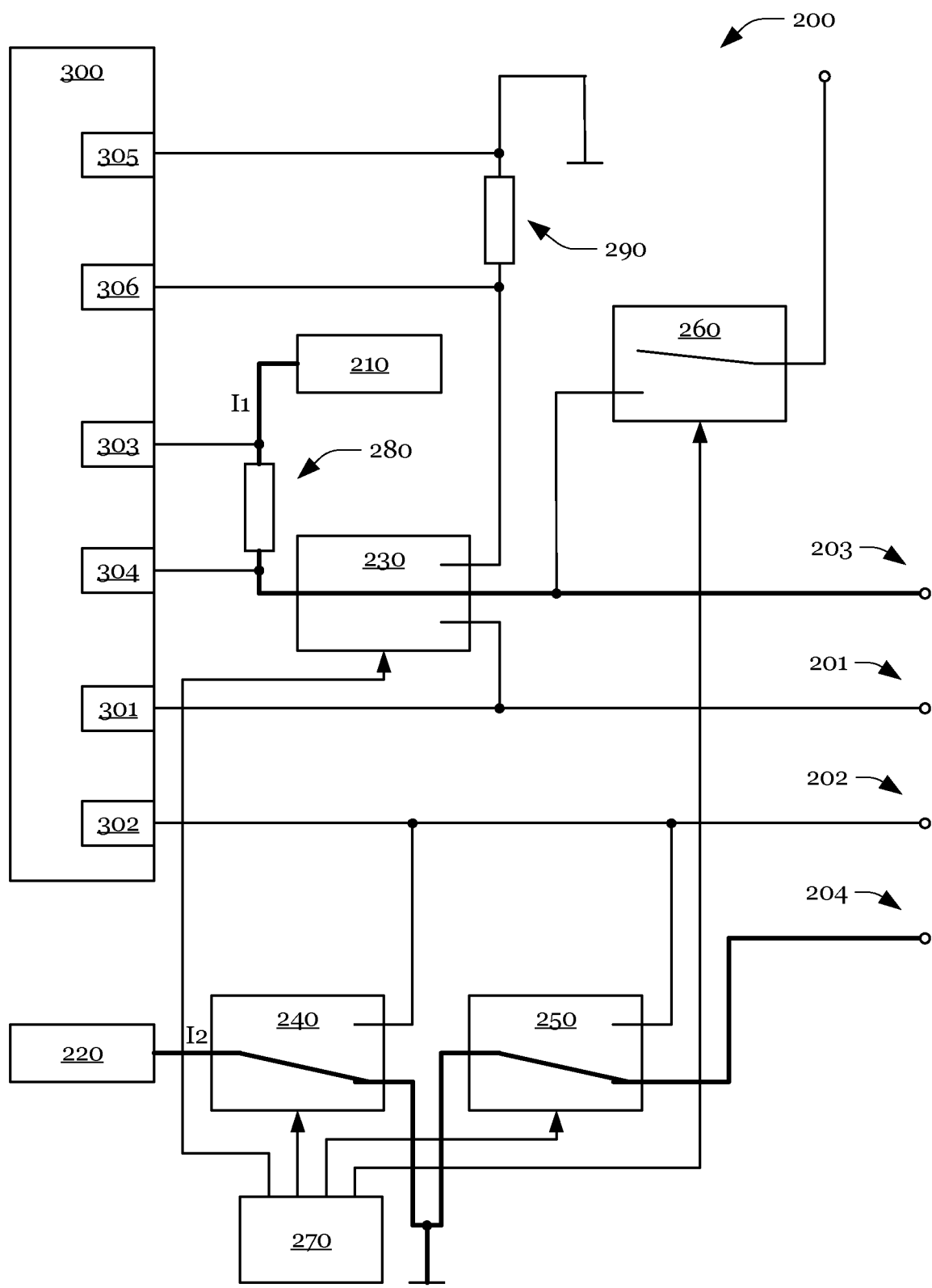
FIG. 7 shows the use of the circuit for implementing a third measurement mode.

FIG. 7 shows the use of circuit 200 for implementing a third measurement mode, in which sensor 140 or sensor 150 is designed, for example, as a 4-wire resistance thermometer. In this measurement mode, switching device 230 connects current source circuit 210 to connection 203, switching device 240 connects current source/sink circuit 220 to the reference potential, and switching device 250 connects the reference potential to connection 204. Test current 11 thus flows through sensor 140 or sensor 150, and the voltage drop over sensor 140 or sensor 150 may be determined from the potential difference between input 301 and input 302. For example, a temperature value may be derived from the voltage drop. A compensation of the line resistance is not necessary, since connection 201 and connection 202 are without current.

Figure 8:
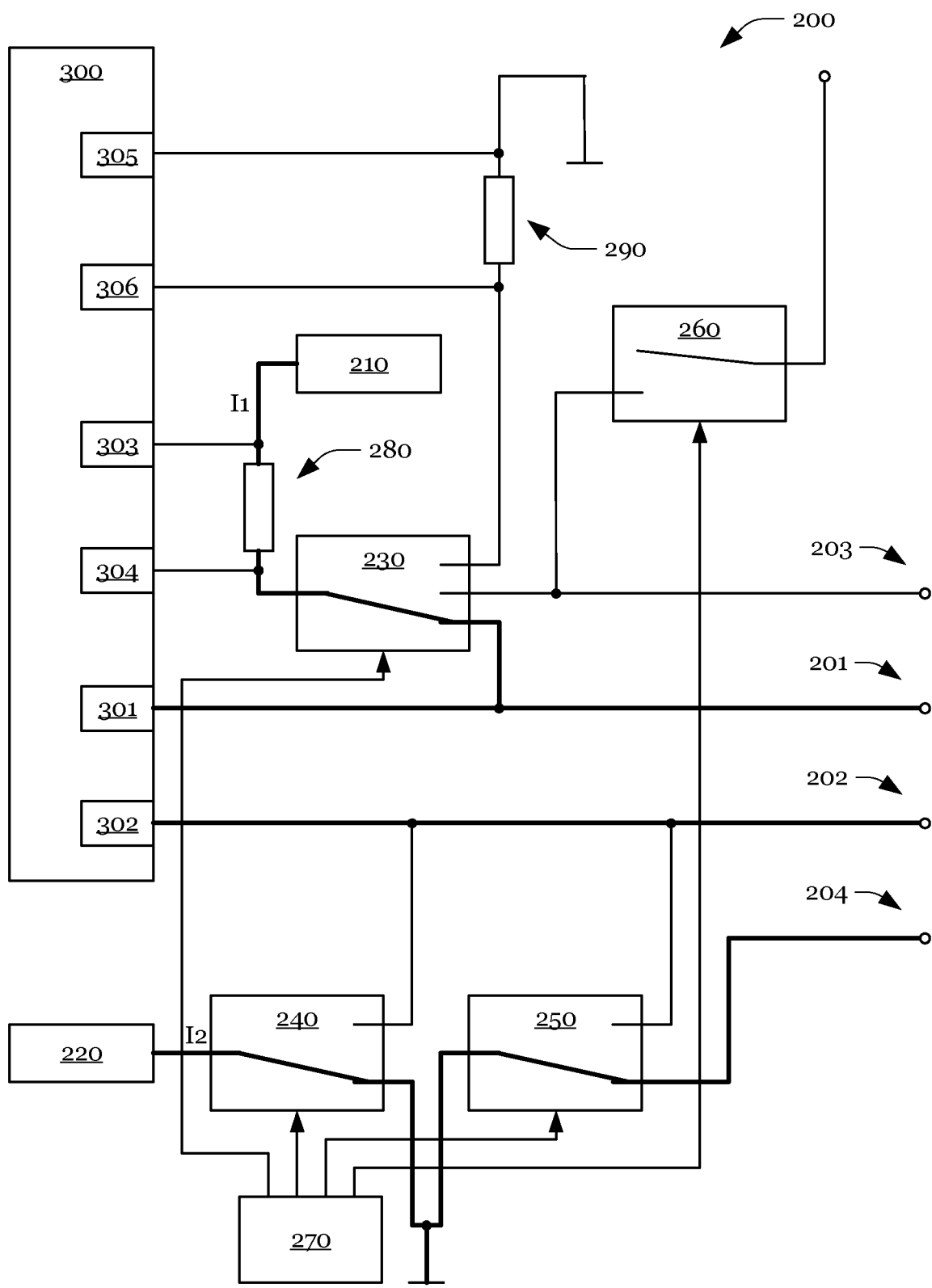
FIG. 8 shows the use of the circuit for implementing a fourth measurement mode.

FIG. 8 shows the use of circuit 200 for implementing a fourth measurement mode, in which sensor 140 or sensor 150 is designed, for example, as a potentiometer. In this measurement mode, switching device 230 connects current source circuit 210 to connection 201, switching device 240 connects current source/sink circuit 220 to the reference potential, and switching device 250 connects the reference potential to connection 204. Test current 11 thus flows through sensor 140 or sensor 150, and the voltage drop over sensor 140 or sensor 150 may be determined from the potential difference between input 301 and input 302. For example, a position of a knob may then be derived from the voltage drop.

Figure 9:
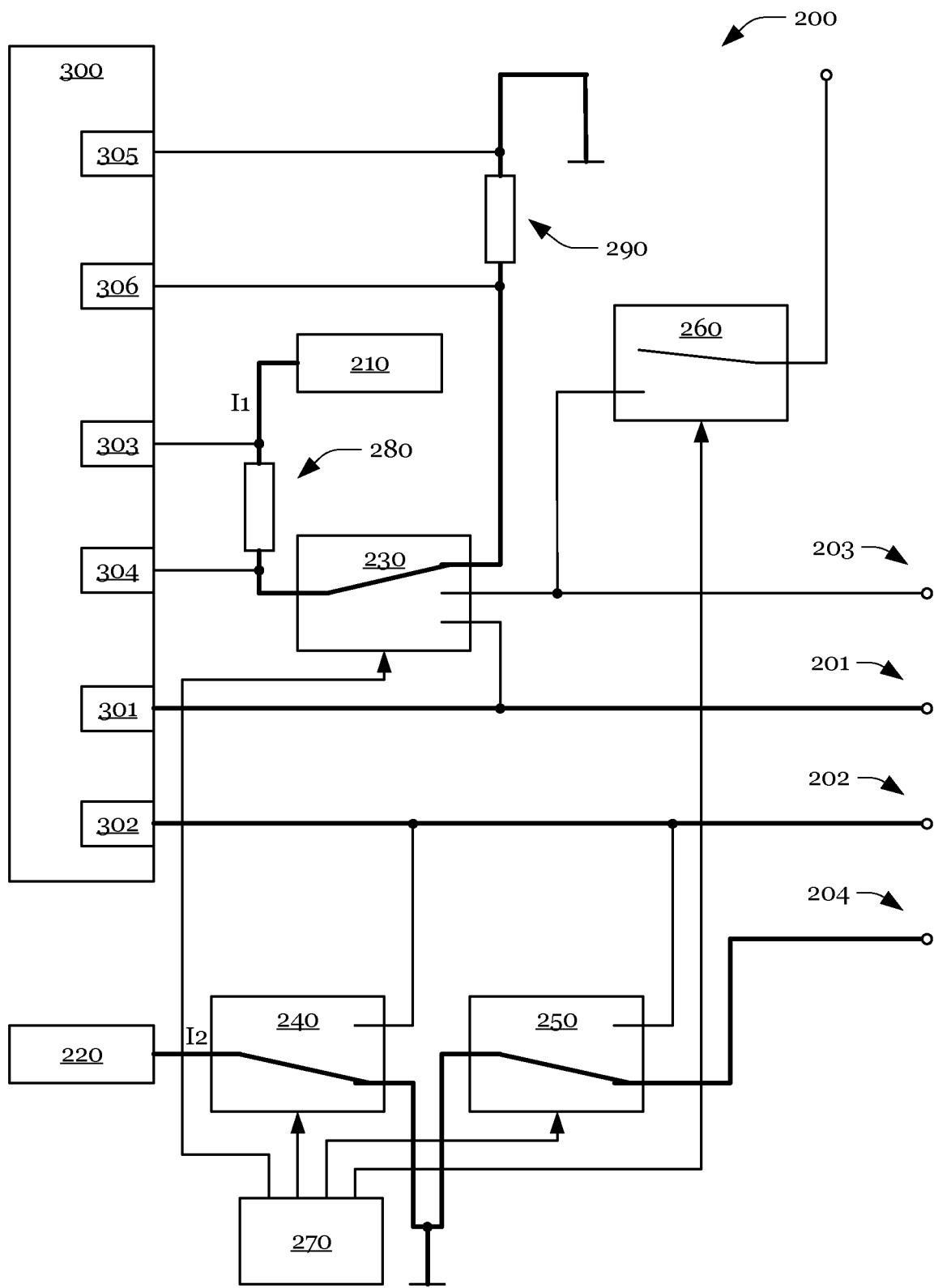
FIG. 9 shows the use of the circuit for implementing a fifth measurement mode.

FIG. 9 shows the use of circuit 200 for implementing a fifth measurement mode, in which sensor 140 or sensor 150 is designed, for example, as a thermocouple. In this measurement mode, switching device 230 connects current source circuit 210 to the reference potential via measuring resistor 290, switching device 240 connects current source/sink circuit 220 to the reference potential, and switching device 250 connects the reference potential to connection 204. ADC 300 reads in the voltage dropping over measuring resistor 290 via input 305 and input 306. Measuring resistor 290 may be part of a resistance thermometer and be used to correct the thermocouple voltage by a temperature-dependent deviation.

Figure 10:
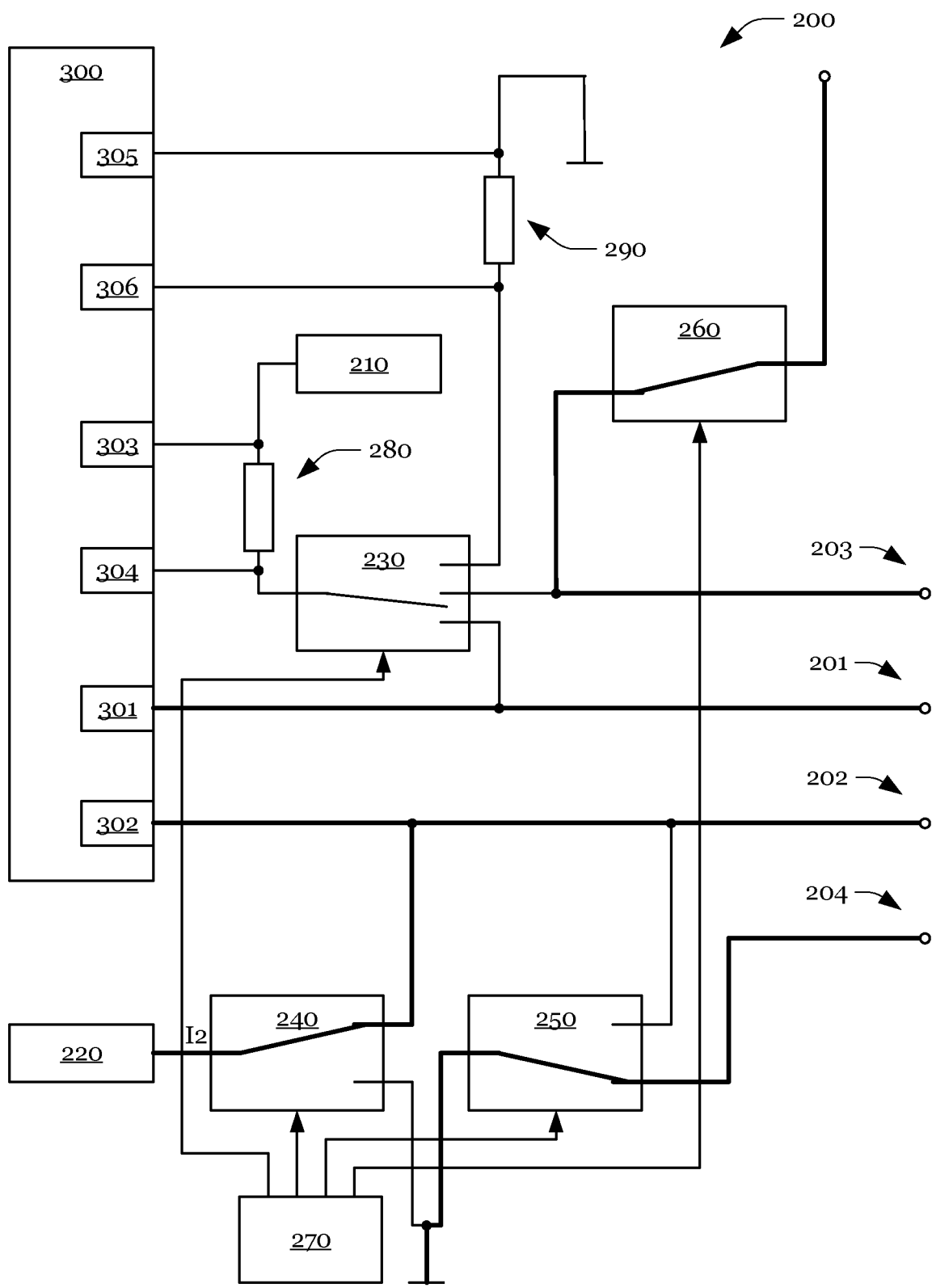
FIG. 10 shows the use of the circuit for implementing a sixth measurement mode.

FIG. 10 shows the use of circuit 200 for implementing a sixth measurement mode, in which sensor 140 or sensor 150 is designed, for example, as strain gauges. In this measurement mode, switching device 260 outputs a constant voltage to connection 203, switching device 240 connects current source/sink circuit 220 to connection 202, and switching device 250 connects the reference potential to connection 204. For example, the strain gauges may be arranged as a bridge circuit, and the bridge mean voltage may be determined from the potential difference between input 301 and input 302.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit for analog/digital conversion, the circuit comprising:
    a first connection, a second connection, a third connection, and a fourth connection to connect a sensor, the first connection, the second connection, the third connection and/or the fourth connection being configured to receive inputs from the sensor;
    an analog/digital converter (ADC) having a first input connected to the first connection and having a second input connected to the second connection;
    a first current source circuit to output a first output current;
    a first switching device for switchably connecting the first current source circuit to the first connection or to the third connection;
    a current source/sink circuit to output a second output current;
    a second switching device for switchably connecting the first current source/sink circuit to a reference potential or to the second connection; and
    a third switching device for switchably connecting the reference potential to the second connection or to the fourth connection.

2. A circuit for analog/digital conversion, the circuit comprising:
    a first connection, a second connection, a third connection, and a fourth connection to connect a sensor;
    an analog/digital converter (ADC) having a first input connected to the first connection and having a second input connected to the second connection;
    a first current source circuit to output a first output current;
    a first switching device for switchably connecting the first current source circuit to the first connection or to the third connection;
    a current source/sink circuit to output a second output current;
    a second switching device for switchably connecting the first current source/sink circuit to a reference potential or to the second connection; and
    a third switching device for switchably connecting the reference potential to the second connection or to the fourth connection,
    wherein the ADC includes a third input and a fourth input,
    wherein the first current source circuit is connected to the first switching device via a resistor, and
    wherein the third input and the fourth input are connected to the resistor.

3. The circuit for analog/digital conversion according to claim 1,
    wherein the first switching device has a leakage current of less than 3 nA or less than 30 pA.

4. The circuit for analog/digital conversion according to claim 1, wherein the circuit includes a control circuit for controlling the first switching device, the second switching device, and the third switching device, the control circuit being configured to switch between multiple measurement modes.

5. The circuit for analog/digital conversion according to claim 4,
    wherein, in a first measurement mode, the first switching device conductively connects the first current source circuit to the first connection,
    wherein, in the first measurement mode, the second switching device conductively connects the current source/sink circuit to the reference potential, and
    wherein, in the first measurement mode, the third switching device conductively connects the reference potential to the second connection.

6. The circuit for analog/digital conversion according to claim 4,
    wherein, in a second measurement mode, the first switching device conductively connects the first current source circuit to the first connection,
    wherein, in the second measurement mode, the second switching device conductively connects the current source/sink circuit to the second connection, and
    wherein, in the second measurement mode, the third switching device conductively connects the reference potential to the fourth connection.

7. The circuit for analog/digital conversion according to claim 4,
    wherein, in a third measurement mode, the first switching device conductively connects the first current source circuit to the third connection,
    wherein, in the third measurement mode, the second switching device conductively connects the current source/sink circuit to the reference potential, and
    wherein, in the third measurement mode, the third switching device conductively connects the reference potential to the fourth connection.

8. The circuit for analog/digital conversion according to claim 4,
    wherein, in a fourth measurement mode, the first switching device conductively connects the first current source circuit to the first connection,
    wherein, in the fourth measurement mode, the second switching device conductively connects the current source/sink circuit to the reference potential, and
    wherein, in the fourth measurement mode, the third switching device conductively connects the reference potential to the fourth connection.

9. The circuit for analog/digital conversion according to claim 4,
    wherein the ADC includes a fifth input and a sixth input, and
    wherein the fifth input and the sixth input are connected to a measuring resistor.

10. The circuit for analog/digital conversion according to claim 9,
    wherein, in a fifth measurement mode, the first switching device conductively connects the first current source circuit to the reference potential via the measuring resistor,
    wherein, in the fifth measurement mode, the second switching device conductively connects the current source/sink circuit to the reference potential, wherein, in the fifth measurement mode, the third switching device conductively connects the reference potential to the fourth connection, and wherein the analog/digital converter is configured to read in a voltage dropping over the measuring resistor via the fifth input and the sixth input.

11. The circuit for analog/digital conversion according to claim 5, including a fourth switching device for the switchable connection of a constant voltage to the third connection.

12. The circuit for analog/digital conversion according to claim 11, wherein, in a sixth measurement mode, the second switching device conductively connects the current source/sink circuit to the second connection, wherein, in the sixth measurement mode, the third switching device conductively connects the reference potential to the fourth connection, and wherein, in the sixth measurement mode, the fourth switching device conductively connects the constant voltage to the third connection.

* * * * *